(12) United States Patent
Liang et al.

(10) Patent No.: US 12,557,647 B2
(45) Date of Patent: Feb. 17, 2026

(54) SEMICONDUCTOR PACKAGE, METHOD OF FORMING THE PACKAGE AND ELECTRONIC DEVICE

(71) Applicants: STMICROELECTRONICS S.r.l., Agrate Brianza (IT); SHENZHEN STS MICROELECTRONICS CO., LTD., Shenzhen (CN)

(72) Inventors: Yi Ming Liang, Shenzhen (CN); Roberto Tiziani, Nerviano (IT); Qian Liu, Shenzhen (CN); Feng Ding, Shenzhen (CN)

(73) Assignees: STMICROELECTRONICS S.r.l., Agrate Brianza (IT); SHENZHEN STS MICROELECTRONICS CO., LTD., Shenzhen (CN)

( * ) Notice: Subject to any disclaimer, the term of this patent is extended or adjusted under 35 U.S.C. 154(b) by 652 days.

(21) Appl. No.: 18/050,413

(22) Filed: Oct. 27, 2022

(65) Prior Publication Data

US 2023/0135498 A1 May 4, 2023

(30) Foreign Application Priority Data

Oct. 29, 2021 (CN) .......................... 202111275853.2

(51) Int. Cl.
*H01L 23/367* (2006.01)
*H01L 23/00* (2006.01)
(Continued)

(52) U.S. Cl.
CPC .......... *H01L 23/3675* (2013.01); *H01L 23/13* (2013.01); *H01L 23/3735* (2013.01);
(Continued)

(58) Field of Classification Search
CPC . H01L 23/3675; H01L 23/13; H01L 23/3735; H01L 24/29; H01L 24/32;
(Continued)

(56) References Cited

U.S. PATENT DOCUMENTS

| 2008/0054439 | A1 | 3/2008 | Malhan et al. |
| 2018/0045885 | A1* | 2/2018 | Canali ............... H01L 23/49827 |
| 2022/0413235 | A1* | 12/2022 | Darmawikarta ..... G02B 6/4274 |

FOREIGN PATENT DOCUMENTS

| CN | 106486431 A | 3/2017 |
| CN | 107346767 A | 11/2017 |

(Continued)

*Primary Examiner* — Patricia D Valenzuela
(74) *Attorney, Agent, or Firm* — Seed Intellectual Property Law Group LLP (57) ABSTRACT

Embodiments of the present disclosure relate to a semiconductor package, a method of forming the package and an electronic device. For example, the semiconductor package may comprise a first substrate assembly comprising a first surface and a second surface opposite the first surface. The semiconductor package may also comprise one or more chips connected or coupled to the first surface of the first substrate assembly by a first thermally and electrically conductive connecting material. In addition, the semiconductor package further comprises a second substrate assembly comprising a third surface and a fourth surface opposite the third surface, the third surface and the first surface being arranged to face each other, and the third surface being connected to one or more chips by a second thermally and electrically conductive connecting material. At least one of the first surface and the third surface is shaped to have a stepped pattern to match a surface of the one or more chips. Embodiments of the present disclosure may at least simplify the double-sided heat dissipation structure and improve the heat dissipation effect of the chip.

17 Claims, 5 Drawing Sheets

(51) Int. Cl.
    *H01L 23/13*       (2006.01)
    *H01L 23/373*      (2006.01)
(52) U.S. Cl.
    CPC .............. *H01L 24/29* (2013.01); *H01L 24/32* (2013.01); *H01L 24/48* (2013.01); *H01L 24/73* (2013.01); *H01L 24/83* (2013.01); *H01L 2224/29111* (2013.01); *H01L 2224/29139* (2013.01); *H01L 2224/29147* (2013.01); *H01L 2224/32225* (2013.01); *H01L 2224/32245* (2013.01); *H01L 2224/48175* (2013.01); *H01L 2224/73215* (2013.01); *H01L 2224/73265* (2013.01); *H01L 2224/8384* (2013.01); *H01L 2924/15151* (2013.01); *H01L 2924/15159* (2013.01); *H01L 2924/1517* (2013.01); *H01L 2924/152* (2013.01)
(58) Field of Classification Search
    CPC ......... H01L 24/48; H01L 24/73; H01L 24/83; H01L 2224/29111; H01L 2224/29139; H01L 2224/29147; H01L 2224/32225; H01L 2224/32245; H01L 2224/48175; H01L 2224/73215; H01L 2224/73265; H01L 2224/8384; H01L 2924/15151; H01L 2924/15159; H01L 2924/1517; H01L 2924/152; H01L 23/4334; H01L 23/3736; H01L 21/4803; H01L 21/50; H01L 21/56; H01L 23/14; H01L 23/3121; H01L 23/367
    See application file for complete search history.

(56) References Cited

FOREIGN PATENT DOCUMENTS

| | | |
|---|---|---|
| CN | 216624256 U | 5/2022 |
| EP | 3410476 A1 | 12/2018 |
| WO | WO 2016117075 A1 | 7/2016 |

* cited by examiner

SEMICONDUCTOR PACKAGE, METHOD OF FORMING THE PACKAGE AND ELECTRONIC DEVICE

BACKGROUND

Technical Field

Embodiments of the present disclosure mainly relate to the field of semiconductors, and more specifically to a semiconductor package, a method of forming the package and an electronic device comprising the semiconductor package.

Description of the Related Art

With the development of high density and miniaturization of electronic products, high integration, thinning, and miniaturization have become mainstream trends. In order to meet design requirements for miniaturization and high integration of modern electronic products, printed circuit boards are usually designed to be small in size. However, with the popularization and application of high-power semiconductor chips, the small-sized circuit board packages also face the challenge of heat dissipation. The limited heat dissipation performance limits the development of power devices towards higher integration and higher power density.

Among traditional heat dissipation schemes, a single-sided heat dissipation scheme is more commonly used. According to the scheme, the heat generated by the power semiconductor chip is conducted directly to the outside of the package surface by placing the power semiconductor chip on an insulated substrate (such as DBC, AMB, IMS, etc.) with thermal conductivity, thereby realizing the heat dissipation of the power semiconductor chip. In addition, other traditional heat dissipation schemes employ a double-sided heat dissipation scheme to further improve heat dissipation performance. However, the double-sided heat dissipation scheme still has problems such as high thermal resistance, an unbalanced thermal conduction path and a complicated assembling process.

BRIEF SUMMARY

According to example embodiments of the present disclosure, a new double-sided heat dissipation scheme is provided.

In a first aspect of the present disclosure, a semiconductor package is provided. The semiconductor package may comprise a first substrate assembly including a first surface and a second surface opposite the first surface. The semiconductor package may also comprise one or more chips connected to the first surface of the first substrate assembly by a first thermally and electrically conductive connecting material. In addition, the semiconductor package may further comprise a second substrate assembly comprising a third surface and a fourth surface opposite the third surface, the third surface and the first surface being arranged to face each other, and the third surface being connected to one or more chips by a second thermally and electrically conductive connecting material. At least one of the first surface and the third surface is shaped to have a stepped pattern to match a surface of the one or more chips.

In a second aspect of the present disclosure, a package forming method is provided. The method may comprise forming a first substrate assembly including a first surface and a second surface opposite the first surface. The method may also comprise connecting one or more chips to the first surface of the first substrate assembly by using a first thermally and electrically conductive connecting material. Additionally, the method may comprise forming a second substrate assembly comprising a third surface and a fourth surface opposite the third surface. Furthermore, the method may further comprise connecting the third surface of the second substrate assembly to the one or more chips in such a manner that the first surface and the third surface are disposed facing each other. At least one of the first surface and the third surface is shaped to have a stepped pattern to match the surface of the one or more chips.

In a third aspect of the present disclosure, there is provided an electronic device, comprising: the semiconductor package as described in the first aspect of the present disclosure; and a power supply module connected to the semiconductor package to power the semiconductor package.

BRIEF DESCRIPTION OF THE SEVERAL VIEWS OF THE DRAWINGS

In conjunction with the accompanying drawings and with reference to the following detailed description, the above and other features, advantages, and aspects of embodiments of the subject matter described herein will become more apparent. In the figures, identical or like reference numbers denote identical or like elements, wherein.

DETAILED DESCRIPTION

Hereinafter, embodiments of the subject matter described herein will be described in more detail with reference to the accompanying drawings. Although some embodiments of the subject matter described herein are illustrated in the drawings, it is to be understood that the subject matter described herein may be implemented through various forms, but may not be interpreted as being limited to the embodiments illustrated herein. On the contrary, these embodiments are only intended to understand the subject matter described herein more thoroughly and completely As used herein, the terms "comprises," "comprises" or like terms should be appreciated as open-ended terms that mean "comprises, but is not limited to." The term "based on" is to be read as "based at least in part on." The term "one example embodiment" and "an example embodiment" are to be read as "at least one example embodiment." The terms "first," "second," and the like may refer to different or same objects. Other definitions, explicit and implicit, may be included below.

Directional terms (such as "top," "bottom," "above," "below," "front," "rear," "head," "tail," "over," "underneath," etc.) may be used with reference to the drawings and/or direction of elements described. Because embodiments may employ a plurality of different directions or orientations, the directional terms are used for purposes of illustration and not limitation. In some instances, directional terms may be interchanged with equivalent directional terms based on the orientations of the embodiments, so long as the general directional relationship between elements and their general purpose are maintained.

In the present disclosure, expressions including ordinal numbers (such as "first," "second," etc.) may modify various elements. However, these elements are not limited to the above expressions. For example, the above expressions do not limit the order and/or importance of the elements. The above expressions are only used to distinguish one element from another.

It should be understood that when an element is referred to as being "connected" or "coupled" to another element, it can be directly connected or coupled to the another element or connected or coupled via an intermediate element. On the contrary, when an element is referred to as being "directly connected" or "directly coupled" to another element, there is not an intermediate element. Other words for describing the relationship between elements should be interpreted in a like fashion (e.g., "between" versus "directly between," "adjacent" versus "directly adjacent," etc.).

In the embodiments described herein or shown in the accompanying drawings, any direct electrical connection or coupling (i.e., any connection or coupling without additional intermediate elements) may also be implemented via indirect connection or coupling (i.e., connected with or coupled to one or more additional intermediate elements), and vice versa, so long as the general purpose of the connection or coupling is substantially maintained.

As described above, with constant development of semiconductor technology, the design of electronic devices presents a trend of miniaturization. However, for power semiconductor chip that generate high heat during operation, efficient and balanced heat dissipation is a prerequisite for ensuring that miniaturized electronic devices can work normally.

For this reason, the heat dissipation scheme usually employs a single-sided heat dissipation scheme and a double-sided heat dissipation scheme. Since the double-sided heat dissipation scheme usually has a better heat dissipation performance, the power semiconductor chip package design based on the double-sided heat dissipation scheme is more favored.

Figure 1A:
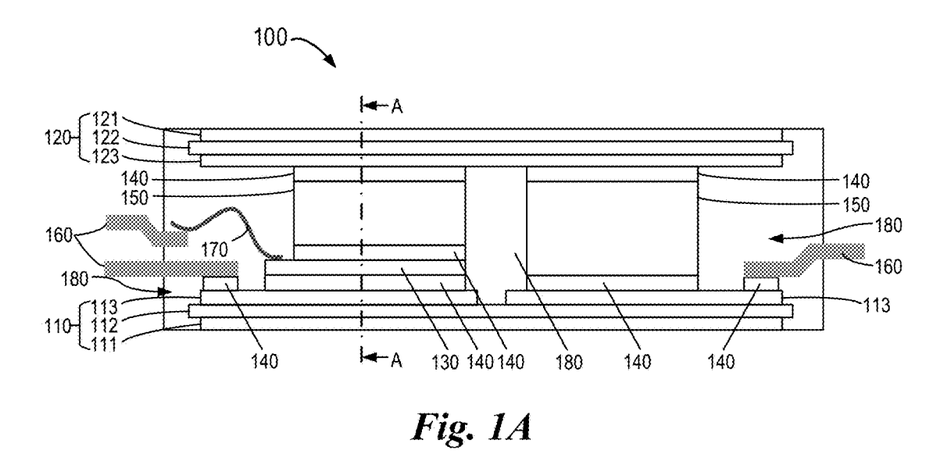
FIG. 1A illustrates a schematic diagram of a conventional semiconductor package based on a double-sided heat dissipation scheme.
Figure 1B:
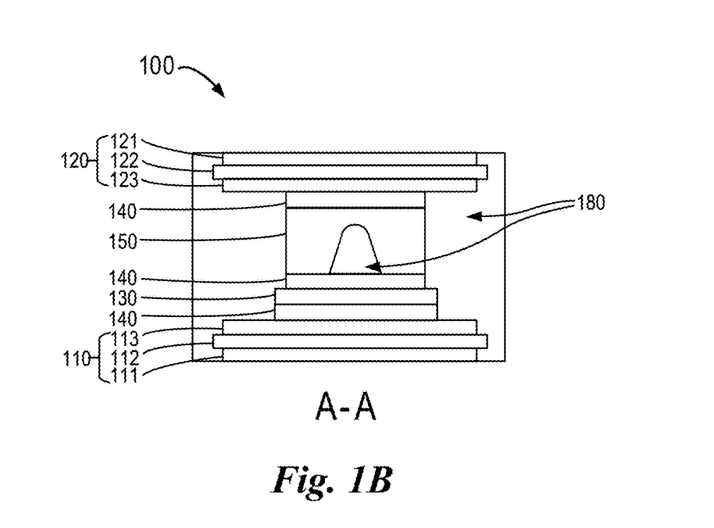
FIG. 1B illustrates a cross-sectional view along line A-A of FIG. 1A of the conventional semiconductor package based on a double-sided heat dissipation scheme.

FIG. 1A illustrates a schematic diagram of a conventional semiconductor package 100 based on a double-sided heat dissipation scheme, and FIG. 1B illustrates a cross-sectional view along line A-A of the conventional semiconductor package 100 based on a double-sided heat dissipation scheme. As shown in FIG. 1A, the chip 130 may be arranged between an insulated substrate 110 and an insulated substrate 120 by using an alloy spacer 150.

As an example, as shown in FIG. 1A and FIG. 1B, the insulated substrate 110 may comprise a copper layer 111, a ceramic layer 112, and a copper layer 113. The chip 130 may be connected with the copper layer 113 by a welding or sintering material 140, whereby the heat generated by the operation of the chip 130 may be conducted to a lower part of the semiconductor package 100 and thereby transferred to the external or other components. In addition, the insulated substrate 120 may comprise a copper layer 121, a ceramic layer 122 and a copper layer 123. The alloy spacer 150 is arranged between the chip 130 and the copper layer 123, and the welding or sintering material 140 is arranged between the chip 130 and the alloy spacer 150 and between the alloy spacer 150 and the copper layer 123. Thus, the heat generated by the operation of the chip 130 may be conducted to an upper portion of the semiconductor package 100 and then transferred to the external or other components.

It should be appreciated that, as shown in FIG. 1A, for a portion without the chip, the alloy spacer 150 may be directly disposed between the copper layer 113 and the copper layer 123 to function to conduct heat and support. In addition, the chip 130 may be connected to a lead frame 160 through a metal conductor wire 170, and the whole arrangement may be packaged with a packaging material 180 such as epoxy resin, thereby achieving the double-sided heat dissipation.

However, the conventional double-sided heat dissipation scheme has the following problems. First, since the alloy spacer 150 is arranged between the copper layer 123 and the chip 130, the heat generated by the chip 130 cannot be directly conducted to the copper layer 123, so the thermal resistance on a longitudinal heat conduction path of the chip 130 is relatively high. Secondly, since an upper side of the chip 130 is arranged with the alloy spacer 150 and the welding or sintering material 140, the thermal resistance of the thermal conduction path upward from the chip 130 is unbalanced with the thermal resistance of the thermal conduction path downward from the chip 130. Furthermore, as shown in FIG. 1A, due to the presence of alloy spacers 150 of different thicknesses, the flatness of the assembled semiconductor package is difficult to control. Furthermore, due to the presence of alloy spacers 150 and more welding or sintering material 140, the overall structure and forming process of the semiconductor package 100 are both more complicated. Therefore, there is a need to improve the traditional double-sided heat dissipation scheme, to overcome or at least alleviate at least one of the above disadvantages.

According to embodiments of the present disclosure, a package-forming scheme is proposed. According to the scheme, the alloy spacer in the conventional heat dissipation scheme is replaced by performing multi-layer etching processing on the insulated substrate, to achieve a more simplified double-sided heat dissipation structure in which the chip is sandwiched by two insulated substrates, to solve the above problems and/or other potential problems. Embodiments of the present disclosure will be described in detail below in conjunction with the above-mentioned example scenarios. It should be appreciated that this is for illustrative purposes only and is not intended to limit the scope of the invention in any way.

Figure 2A:
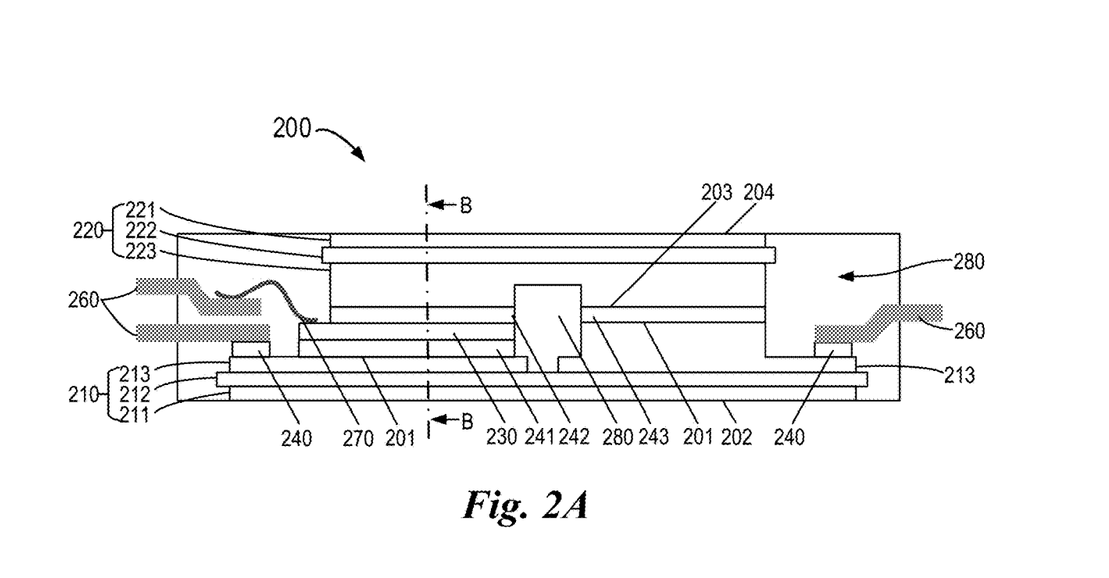
FIG. 2A illustrates a schematic diagram of a semiconductor package according to an embodiment of the present disclosure.
Figure 2B:
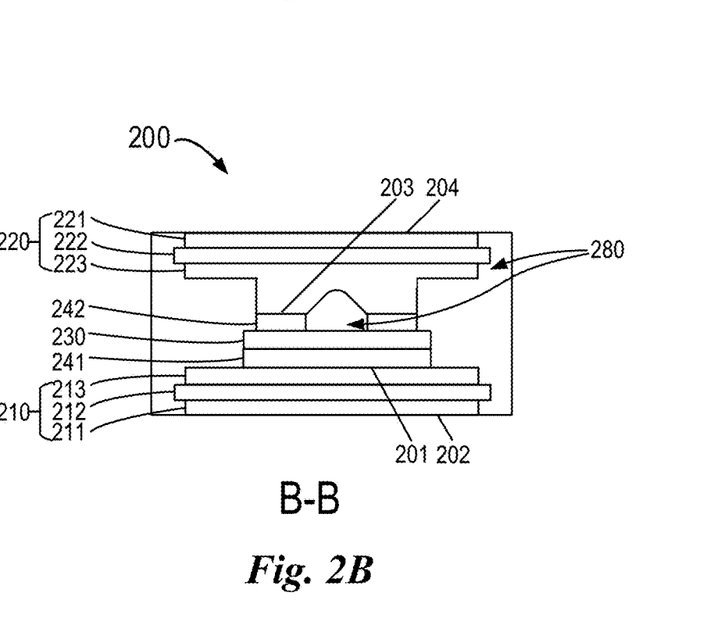
FIG. 2B illustrates a cross-sectional view along line B-B of FIG. 2A of a semiconductor package according to an embodiment of the present disclosure.

FIG. 2A illustrates a schematic diagram of a semiconductor package 200 according to an embodiment of the present disclosure. FIG. 2B illustrates a cross-sectional view along line B-B of the semiconductor package 200 according to an embodiment of the present disclosure. It should be appreciated that the semiconductor package 200 shown in FIG. 2A and FIG. 2B is merely one example in which embodiments of the present disclosure may be implemented, and is not intended to limit the scope of the present disclosure.

As shown in FIG. 2A and FIG. 2B, the semiconductor package 200 may comprise a first substrate assembly 210.

As an example, the first substrate assembly 210 may comprise a first surface 201, such as a front surface, and a second surface 202, such as a back surface, opposite the first surface 201. In some embodiments, the first substrate assembly 210 is an insulated substrate, which may be composed of a first metal layer 211 such as copper, a first insulating layer 212 such as ceramic, and a first shaped metal layer 213 such as copper. It should be understood that the copper in the above-mentioned embodiments may be replaced by other thermally conductive and electrically conductive materials, and the ceramic in the above-mentioned embodiments may be replaced by other thermally conductive and insulating materials.

Furthermore, in some embodiments, the semiconductor package 200 may further comprise a chip 230. As an example, the chip 230 may be a die. It should be understood that, in addition to the chip 230 shown in FIG. 2A and FIG. 2B, the semiconductor package 200 may further comprise one or more other chips. In some embodiments, the chip 230 is connected to the first surface 201 of the first substrate assembly 210 by a first thermally and electrically conductive connecting material 241. It should be understood that the first thermally and electrically conductive connecting material 241 may be a welding or sintering material with thermal conductivity, such as silver, copper, tin solder, and the like. While the first thermally and electrically conductive connective material 241 may be referred to as the first thermally conductive connecting material 241 in this disclosure, the connective material 241 has both the thermal and electrical conductive properties.

Additionally, in some embodiments, the semiconductor package 200 may further comprise a second substrate assembly 220. As an example, the second substrate assembly 220 may comprise a third surface 203, such as a front surface, and a fourth surface 204 opposite the third surface 203. In some embodiments, the second substrate assembly 220 is an insulated substrate, which may be composed of a second metal layer 221 such as copper, a second insulating layer 222 such as ceramic, and a second shaped metal layer 223 such as copper. It should be understood that the copper in the above-mentioned embodiments may be replaced by other thermally conductive and electrically conductive materials, the ceramic in the above-mentioned embodiments may be replaced by other thermally conductive and insulating materials, and the assembling manner of the first substrate assembly 210 may be the same as or different from that of the second substrate assembly 220.

As shown in FIG. 2A or FIG. 2B, in some embodiments, the third surface 203 is arranged downward, and the first surface 201 is arranged upward, so the third surface 203 and the first surface 201 are arranged opposed to each other. Furthermore, the third surface 203 may be connected to the chip 230 by the second thermally and electrically conductive connecting material 242. It should be understood that the second thermally conductive connecting material 242 may be a welding or sintering material having a thermal conduction function, such as silver, copper, tin solder, etc., and the second thermally conductive connecting material 242 and the first thermally conductive connecting material 241 may be the same or different thermally conductive materials. While the second thermally and electrically conductive connective material 242 may be referred to as the second thermally conductive connecting material 242 in this disclosure, the connective material 242 has both thermal and electrical conductive properties.

Furthermore, in some embodiments, at least one of the first surface 201 and the third surface 203 is shaped to have a stepped pattern so as to match at least the surface of the chip 230. It should be appreciated that "shaping" as used herein refers to processing a workpiece and product into a desired shape. In some embodiments, the shaping process may be a multi-layer etching process or a half etching process or the like. As an example, as shown in FIG. 2A or FIG. 2B, the first shaped metal layer 213 is formed by multi-layer etching of the first surface 201, and the second shaped metal layer 223 is formed by multi-layer etching of the third surface 203. Specifically, as shown in FIG. 2A, a portion of the first surface 201 on a left side of the figure is configured for connection with the chip 230, e.g., by an etching process. Since this portion is connected to the chip 230, there are high requirements for the surface roughness and flatness of this portion, which need to be adapted for the connection requirements of the chip 230 and the second substrate assembly 220 above. Accordingly, a portion of the first surface 201 on the right side of the figure is configured for connection with the second substrate assembly 220. This portion is the original surface before the above three layers of materials of the first substrate assembly 210 are connected.

As shown in FIG. 2A, the portion of the first surface 201 on the left side of the figure and the portion of the first surface 201 on the right side of the figure have different plane heights, rendering a step pattern. Furthermore, as shown in FIG. 2A, there is a circuit isolation formed by etching between the portion of the first surface 201 on the left side of the figure and the portion of the first surface 201 on the right side of the figure. In this way, the formed step pattern may be used to replace the alloy spacer in the traditional double-sided heat dissipation scheme, so that at least the double-sided heat dissipation structure can be simplified and the heat dissipation effect of the chip can be improved.

In some embodiments, the thickness of the above-mentioned shaped metal layer (especially the second shaped metal layer 223) may be formed to a predetermined dimension, for example, the dimension may be in a range of 0.2 mm to 1.5 mm, preferably, the dimension may be in a range of 0.3 mm to 1.3 mm, more preferably, the dimension may be in a range of 0.5 mm to 1.0 mm, for example, the dimension is 0.8 mm. In this way, the thickness of the semiconductor package 200 may be reduced, thereby improving the overall integration of the semiconductor device.

In an alternative embodiment, the thickness of the above-mentioned shaped metal layers (especially the second shaped metal layer 223) may have a dimension in a range of 1.5 mm to 3 mm, preferably, the dimension may be in a range of 1.6 mm to 2.6 mm, more preferably, the dimension may be in a range of 1.5 mm to 2.5 mm, for example, the dimension is 2 mm. In this way, it is possible to improve an internal space of the semiconductor package 200, so that the wiring manner of the metal conductor wire 270 can be easily designed, for example, the metal conductor wire 270 may be arranged below the second substrate assembly 220.

It should be understood that the first substrate assembly 210 and the second substrate assembly 220 may be prepared in advance, or customized from other manufacturers. In this way, a main portion of the semiconductor package 200 comprises only three assemblies, i.e., the first substrate assembly 210, the second substrate assembly 220 and the chip 230, thereby simplifying the structure of the semiconductor package. In addition, the semiconductor package 200 improves the thermal resistance of the thermal conduction path by replacing the alloy spacer in the conventional double-sided heat dissipation scheme with the stepped pattern formed by the substrate assemblies after multiple-layer etching.

In some embodiments, for the portion without the chip, the third surface 203 may also be connected to the first surface 201 by a third thermally and electrically conductive connecting material 243. In other words, as shown in FIG. 2A, the first shaped metal layer 213 and the second shaped metal layer 223 may both be shaped, e.g., etched in multiple layers in advance so that they are connected by the third thermally conductive connecting material 243. In this way, the semiconductor package 200 can still be supported in a case that the alloy spacer in the conventional double-sided heat dissipation scheme is not included.

Furthermore, in some embodiments, the semiconductor package 200 may further comprise a metal conductor wire 270, which may be used to connect the chip 230 to a lead frame 260. As shown in FIG. 2A, the lead frame 260 may be electrically connected to the first shaped metal layer 213 by a connecting material 240, thereby realizing the electrical connection between the chip 230 and the outside of the semiconductor package 200. As an example, the connection between the lead frame 260 and the first substrate assembly 210 generally comprises three ways: soldering, sintering or ultrasonic welding. Therefore, when the lead frame 260 and the first substrate assembly 210 are connected by ultrasonic welding, the connecting material 240 may not exist between the lead frame 260 and the first substrate assembly 210.

In some embodiments, the first thermally conductive connecting material 241, the second thermally conductive connecting material 242 and the third thermally conductive connecting material 243 may be at least one material selected from silver, copper, and tin solder. While the third thermally and electrically conductive connective material 243 may be referred to as the third thermally conductive connecting material 243 in this disclosure, the connective material 243 retains both properties of thermal and electrical conductivity.

It is noted that the connection materials in the packages of this disclosure are electrically conductive, i.e. the alloy spacers, welding materials, and sintering materials. The connection materials between the ceramic layers 222 and 212 are electrically conductive and form circuits in these packages. For example, the chip 230 of FIG. 2A is a semiconductor MOSFET, which in operation has an electrical signal that can flow from the left upper lead frame 260 (left side of this Figure) to the wire 270, ultimately coupled to the chip 230 to provide control signals. Power is provided to the package from the left lower lead frame 260 and the connecting material 240 (left side of FIG. 2A).

The connecting material 240 is coupled to the first shaped metal layer 213, which is coupled to the first thermally conductive connecting material 241. The chip 230 is electrically coupled between the first connecting material 241 and the second connecting material 242. The second shaped metal layer 223 coupled to the second connective material 242. A third thermally conductive connecting material 243 is coupled to the second shaped metal layer 223, which is coupled to the first shaped metal layer 213 (right side of the Figure), which is coupled to the lead frame 260 and the connecting material 240. The signals and power can flow through these electrically connected components and layers in a variety of configurations as suitable for the end product. The different metal layers and connecting materials may be physically coupled or physically and electrically coupled together in the end product as suitable for the product specifications.

In some embodiments, the semiconductor package 200 may further comprise a packaging material 280. The packaging material 280 is located between the first substrate assembly 210, the chip 230 and the second substrate assembly 220 and configured to fill a remaining space in the semiconductor package 200, thereby forming the semiconductor package 200.

In some embodiments, the first substrate assembly 210 and the second substrate assembly 220 are made of the same material. Alternatively or additionally, the first substrate assembly 210 and the second substrate assembly 220 have coefficient of thermal conductivity that differ by less than a threshold percentage, e.g., the coefficient of thermal conductivity of the two differs by 10% or less.

In some embodiments, as shown in FIG. 2A and FIG. 2B, the first surface 201 and the third surface 203 are both etched in multiple layers to form stepped patterns that fit with each other to receive the chip 230. That is to say, both the first substrate assembly 210 and the second substrate assembly 220 are pre-processed by multi-layer etching, so as to ensure as much as possible that the thermal resistances of the upward and downward heat conduction paths of the chip 230 are the same.

In one embodiment, ends of the insulating layer 212 are closer to an outer edge of the package than ends of the shaped layer 213. The shaped layer 213 includes a first portion that the chip 230 is coupled to and a second portion that is coupled to the second shaped metal layer 223. The second portion includes an interior surface that is spaced further from the first metal layer 211 than an interior surface of the first portion.

Figure 3:
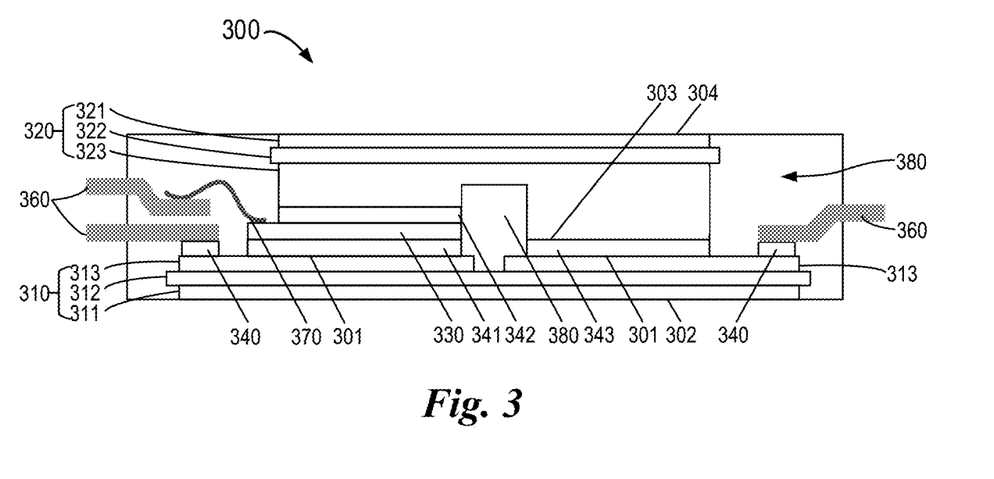
FIG. 3 illustrates a schematic diagram of an alternative exemplary semiconductor package according to an embodiment of the present disclosure.

The second shaped metal layer 223 includes a first portion that is coupled to the insulating layer 222 and a second portion that extends away from the first portion. The second portion is coupled to the chip 230. The first portion has ends that are closer to outer edges of the package than ends of the second portion. In some embodiments, in order to simplify the process, only one of the first substrate assembly 210 and the second substrate assembly 220 may be subjected to multi-layer etching process in advance. FIG. 3 shows a schematic diagram of a semiconductor package 300 in which only a second substrate assembly 320 is pre-processed by multi-layer etching according to an embodiment of the present disclosure.

As shown in FIG. 3, the semiconductor package 300 may comprise a first substrate assembly 310. As an example, the first substrate assembly 310 may comprise a first surface 301 such as a front surface, and a second surface 302 such as a back surface, opposite the first surface 301. In some embodiments, the first substrate assembly 310 is an insulted substrate, and may comprise a first metal layer 311, a first insulating layer 312 and a first shaped metal layer 313. As shown in FIG. 3, the first shaped metal layer 313 has not undergone the multi-layer etching process.

In addition, the semiconductor package 300 may further comprise a second substrate assembly 320. As an example, the second substrate assembly 220 may comprise a third surface 303 and a fourth surface 304 opposite the third surface 303. In some embodiments, the second substrate assembly 320 is an insulated substrate, which may comprise a second metal layer 321, a second insulating layer 322, and a second shaped metal layer 323. As shown in FIG. 3, the second shaped metal layer 323 is pre-processed by multi-layer etching, wherein a portion on the left side is processed to be the same as the corresponding portion of FIG. 2A, and a portion on the right side is processed to have a large thickness relative to the corresponding portion shown in FIG. 2A, so that the second substrate assembly connects the first substrate assembly 310 by a second thermally and electrically conductive connecting material 343. In this way, the multi-layer etching process performed in advance may be simplified.

It should be appreciated that the alternative embodiment may also comprise the semiconductor package 300 in which only the first substrate assembly 310 is subjected to a multi-layer etching process in advance.

The technical solutions described above are only used for example, rather than limiting the present invention. It should be understood that the entire semiconductor package may also be arranged in other manners and connection relationship. In order to more clearly explain the principle of the above solution, the formation process of the above-mentioned semiconductor package of the present disclosure will be described in more detail below with reference to FIG. 4. In addition, various stages of forming a semiconductor package will be described in detail below with reference to FIG. 5A through FIG. 5C.

Figure 4:
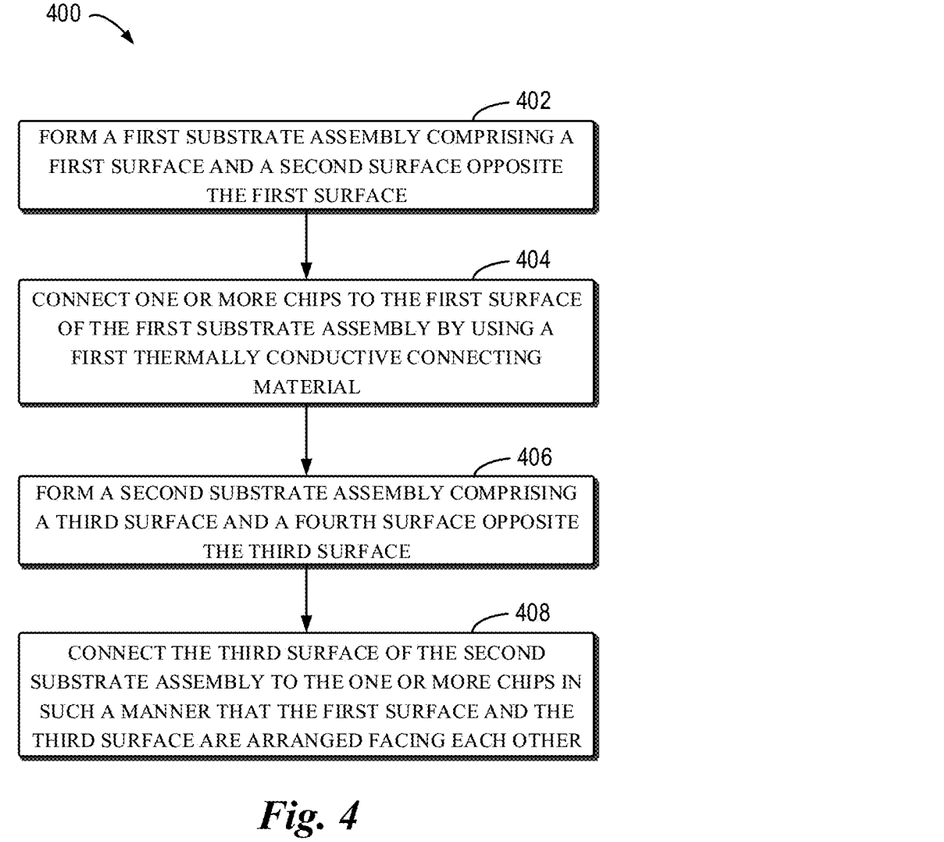
FIG. 4 illustrates a flowchart of a process of forming a semiconductor package according to an embodiment of the present disclosure.
Figure 5A:
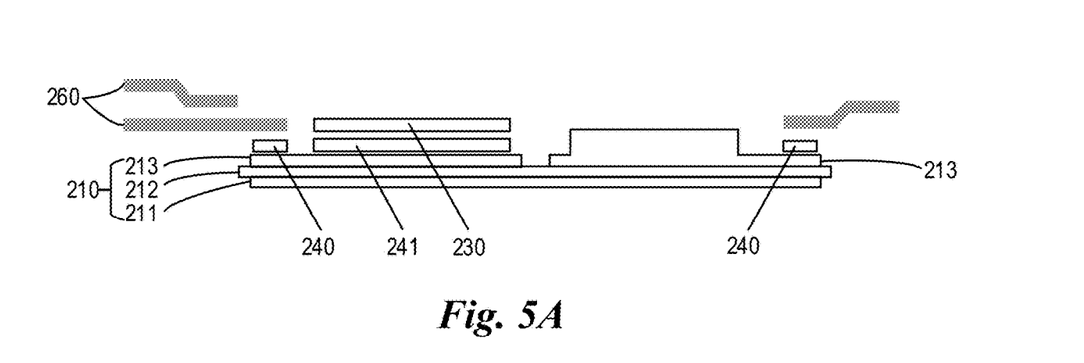
FIG. 5A through FIG. 5C illustrate schematic diagrams of various stages of forming a semiconductor package in accordance with embodiments of the present disclosure.
Figure 5B:
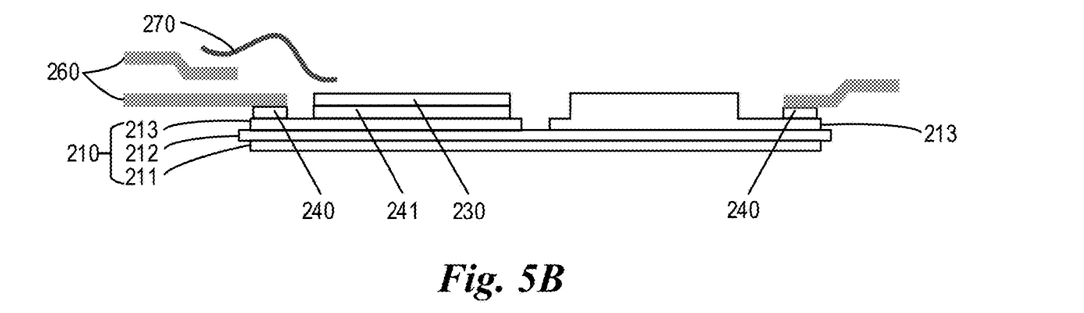
Figure 5C:
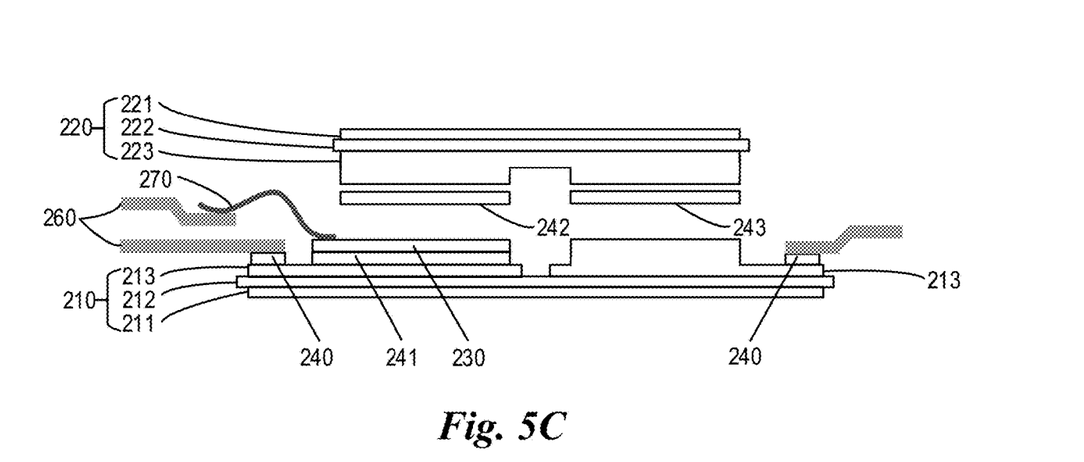

FIG. 4 shows a flowchart of a process 400 of forming a semiconductor package in accordance with an embodiment of the present disclosure. FIG. 5A through FIG. 5C illustrate schematic diagrams of various stages of forming a semiconductor package in accordance with embodiments of the present disclosure. For ease of understanding, the specific examples mentioned in the following description are all illustrative, and are not intended to limit the protection scope of the present disclosure.

At block 402, a first substrate assembly is formed. As an example, a first substrate assembly 210 is provided. It should be understood that the first substrate assembly 210 may be prefabricated. In some embodiments, the first substrate assembly 210 may be formed by combining the first metal layer 211, the first insulating layer 212 and the first shaped metal layer 213. For example, the first metal layer 211, the first insulating layer 212 and the first shaped metal layer 213 may be combined into one body by pressing. In addition, the first shaped metal layer 213 is configured to receive or place the chip 230, so the first shaped metal layer 213 needs to be etched in multiple layers in advance to form a stepped pattern having a shape that matches the chip 230 and a partial space replacing the alloy spacer in the traditional double-sided heat dissipation scheme. It should be appreciated that the first shaped metal layer 213 is formed by performing multi-layer etching on the upper surface of the first substrate assembly 210.

At block 404, referring to the assembly welding or sintering stage shown in FIG. 5A, the first thermally conductive connecting material 241 may be used to connect the chip 230 to the multi-layer etched upper surface of the first substrate assembly 210. Furthermore, in order to connect the lead frame 260, additional connecting material 240 is arranged above the first shaped metal layer 213.

The flow enters a conductor wire connecting stage shown in FIG. 5B by connecting the above components. As an example, the metal conductor wire 270 is provided for electrically connecting the chip 230 with the lead frame 260.

At block 406, a second substrate assembly is formed. As an example, the second substrate assembly 220 may be provided. It should be understood that the second substrate assembly 220 may be prefabricated. In some embodiments, the second substrate assembly 220 may be formed by combining the second metal layer 221, the second insulating layer 222 and the second shaped metal layer 223. For example, the second metal layer 221, the second insulating layer 222 and the second shaped metal layer 223 may be combined into one body by pressing.

In addition, the second shaped metal layer 223 is configured to cover the chip 230 and connect a portion of the first shaped metal layer 213 not covered by the chip 230, so the second shaped metal layer 213 needs to be multiple-layer etched in advance to form a stepped pattern having a shape that matches the chip 230 and a partial space replacing the alloy spacer in the traditional double-sided heat dissipation scheme. It should be appreciated that the second shaped metal layer 223 is formed by performing multi-layer etching on the lower surface of the second substrate assembly 210. It should be appreciated that the step at block 402 and the step at block 406 may be completed at a supplier, and the block 402, block 404 and block 406 may be completed in any reasonable order or in parallel.

At block 408, during a further assembly welding or sintering stage as shown in FIG. 5C, an upper surface of the first substrate assembly 210 and a lower surface of the second substrate assembly 220 are disposed facing each other with the lower surface of the second substrate assemblies 220 connecting the chip 230.

It is noted that although FIG. 5A through FIG. 5C show that both the upper surface of the first substrate assembly 210 and the lower surface of the second substrate assembly 220 are formed in a stepped pattern, this embodiment is not intended to limit the protection scope of the present disclosure. At least one of the upper surface of the first substrate assembly 210 and the lower surface of the second substrate assembly 220 may be shaped to have a stepped pattern to match the surface of the chip 230.

In some embodiments, as shown in FIG. 5C, the lower surface of the second substrate assembly 220 may also be connected to the upper surface of the first substrate assembly 210 by a third thermally conductive connecting material 243.

In some embodiments, as shown in FIG. 5C, the upper surface of the first substrate assembly 210 and the lower surface of the second substrate assembly 220 are both etched in multiple layers to form stepped patterns that fit with each other to receive the chip 230.

In some embodiments, the first thermally conductive connecting material 241, the second thermally conductive connecting material 242, and the third thermally conductive connecting material 243 are at least one of silver, copper, and tin solder.

In some embodiments, the combination of the first substrate assembly 210, the chip 230, and the second substrate assembly 220 may also be packaged by a packaging material.

In some embodiments, the first substrate assembly 210 and the second substrate assembly 220 may be made of the same material, or have coefficient of thermal conductivity that differs by less than a threshold percentage.

It should be appreciated that the semiconductor package produced by the above-described process may be used in an electronic device such as a vehicle system control unit having a demand for a power chip. In certain embodiments, the electronic device may comprise the semiconductor package as described above in various embodiments and combinations thereof. In addition, the electronic device may further comprise a power supply module connected to the above-mentioned semiconductor package to power the semiconductor package.

In summary, the present disclosure achieves a more efficient heat dissipation path by applying an insulated substrate with a specific stepped pattern after a specific forming process to the double-sided heat dissipation scheme. For example, since the multi-layer etched or half-etched portion of the insulated substrate may replace the alloy spacer in the traditional double-sided heat dissipation scheme, the double-sided heat dissipation scheme of the present disclosure has a significantly reduced thermal resistance, and the heat dissipation paths upward and downward from the chip substantially achieve thermal balance. In addition, since the double-sided heat dissipation solution of the present disclosure omits the spacer, the number of components is reduced, and the assembling process is simplified. In addition, since the multi-layer etching process also improves the flatness of the insulated substrate, thereby enhancing the packaging quality.

Without prejudice to the underlying principles, details and embodiments may vary, even significantly, from the content that has been described by way of example only, without departing from the protection scope.

The claims are an integral part of the technical teaching provided herein with respect to the embodiments.

The protection scope is determined by the appended claims.

A semiconductor package, may be summarized as including a first substrate assembly including a first surface and a second surface opposite the first surface; one or more chips connected to the first surface of the first substrate assembly by a first thermally conductive connecting material; and a second substrate assembly including a third surface and a fourth surface opposite the third surface, the third surface and the first surface being arranged to face each other, and the third surface being connected to one or more chips by a second thermally conductive connecting material, wherein at least one of the first surface and the third surface is shaped to have a stepped pattern to match a surface of the one or more chips.

The third surface may also be connected to the first surface by a third thermally conductive connecting material.

The first substrate assembly may include a first metal layer, a first insulating layer and a first shaped metal layer, the first shaped metal layer being formed by multi-layer etching of the first surface.

The second substrate assembly may include a second metal layer, a second insulating layer and a second shaped metal layer, the second shaped metal layer being formed by multi-layer etching of the third surface.

The first surface and the third surface may both be multi-layer etched to form the stepped patterns that fit with each other to receive the one or more chips.

The semiconductor package may further include a metal conductor wire for connecting the one or more chips to a lead frame.

The first thermally conductive connecting material, the second thermally conductive connecting material and the third thermally conductive connecting material may be at least one of the following materials: silver; copper; and tin solder.

The semiconductor package may further include a packaging material located between the first substrate assembly, the one or more chips and the second substrate assembly.

The first substrate assembly and the second substrate assembly may be made of the same material or have coefficient of thermal conductivity that differ by less than a threshold percentage.

A package forming method, may be summarized as including forming a first substrate assembly including a first surface and a second surface opposite the first surface; connecting one or more chips to the first surface of the first substrate assembly by using a first thermally conductive connecting material; forming a second substrate assembly including a third surface and a fourth surface opposite the third surface; and connecting the third surface of the second substrate assembly to the one or more chips in such a manner that the first surface and the third surface are arranged to face each other, wherein at least one of the first surface and the third surface is shaped to have a stepped pattern to match a surface of the one or more chips.

The third surface may also be connected to the first surface by a third thermally conductive connecting material.

The method according may further include forming the first substrate assembly by combining a first metal layer, a first insulating layer and a first shaped metal layer, the first shaped metal layer being formed by multi-layer etching of the first surface.

The method according may further include forming the second substrate assembly by combining a second metal layer, a second insulating layer and a second shaped metal layer, the second shaped metal layer being formed by multi-layer etching of the third surface.

The first surface and the third surface may both be multi-layer etched to form the stepped patterns that fit with each other to receive the one or more chips.

The method according may further include connecting the one or more chips to a lead frame via a metal conductor wire.

The first thermally conductive connecting material, the second thermally conductive connecting material and the third thermally conductive connecting material may be at least one of the following materials: silver; copper; and tin solder.

The method may further include packaging a combination of the first substrate assembly, the one or more chips and the second substrate assembly via a packaging material to form the package.

The first substrate assembly and the second substrate assembly may be made of the same material or have coefficient of thermal conductivity that differ by less than a threshold percentage.

An electronic device, may be summarized as including the semiconductor package; and a power supply module connected to the semiconductor package to power the semiconductor package.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor package, comprising:
   a first substrate assembly comprising a first surface and a second surface opposite the first surface, the first substrate assembly including a first shaped metal layer including a first portion and a second portion;

one or more chips coupled to the first surface of the first substrate assembly by a first thermally and electrically conductive connecting material; and a second substrate assembly comprising a third surface and a fourth surface opposite the third surface, the third surface and the first surface facing each other, the third surface being coupled to one or more chips by a second thermally and electrically conductive connecting material, the second substrate assembly including a second shaped metal layer including a first portion and a second portion, the one or more chips positioned between the first portion of the first shaped metal layer and the first portion of the second shaped metal layer, wherein the first portion of the first shaped metal layer has a smaller thickness than the second portion of the first shaped metal layer such that the first surface has a stepped pattern to match a surface of the one or more chips, or the first portion of the second shaped metal layer has a smaller thickness than the second portion of the second shaped metal layer such that the third surface has a stepped pattern to match a surface of the one or more chips.

2. The semiconductor package according to claim 1, wherein the third surface is also coupled to the first surface by a third thermally and electrically conductive connecting material.

3. The semiconductor package according to claim 1, wherein the first substrate assembly comprises a first metal layer and a first insulating layer, the first shaped metal layer being formed by multi-layer etching of the first surface.

4. The semiconductor package according to claim 1, wherein the second substrate assembly comprises a second metal layer and a second insulating layer, the second shaped metal layer being formed by multi-layer etching of the third surface.

5. The semiconductor package according to claim 1, wherein the first surface and the third surface are both multi-layer etched to form the stepped patterns that fit with each other to receive the one or more chips.

6. The semiconductor package according to claim 1, further comprising:
a metal conductor wire for connecting the one or more chips to a lead frame.

7. The semiconductor package according to claim 2, wherein the first thermally and electrically conductive connecting material, the second thermally and electrically conductive connecting material and the third thermally and electrically conductive connecting material are at least one of the following materials:
silver;
copper; and
tin solder.

8. The semiconductor package according to claim 1, further comprising:
a packaging material located between the first substrate assembly, the one or more chips and the second substrate assembly.

9. The semiconductor package according to claim 1, wherein the first substrate assembly and the second substrate assembly are made of the same material or have coefficient of thermal conductivity that differ by less than a threshold percentage.

10. A method, comprising:
forming a first substrate assembly comprising a first surface and a second surface opposite the first surface, the first substrate assembly including a first shaped metal layer including a first portion and a second portion;

coupling one or more chips to the first surface of the first substrate assembly by using a first thermally and electrically conductive connecting material;

forming a second substrate assembly comprising a third surface and a fourth surface opposite the third surface, the second substrate assembly including a second shaped metal layer including a first portion and a second portion; and coupling the third surface of the second substrate assembly to the one or more chips, the first surface and the third surface facing each other, the one or more chips positioned between the first portion of the first shaped metal layer and the first portion of the second shaped metal layer, wherein the first portion of the first shaped metal layer has a smaller thickness than the second portion of the first shaped metal layer such that the first surface has a stepped pattern, or the first portion of the second shaped metal layer has a smaller thickness than the second portion of the second shaped metal layer such that the third surface has a stepped pattern.

11. The method according to claim 10, wherein the third surface is also coupled to the first surface by a third thermally and electrically conductive connecting material.

12. The method according to claim 10, further comprising:
forming the first substrate assembly by combining a first metal layer, a first insulating layer and the first shaped metal layer; and
forming the first shaped metal layer by multi-layer etching of the first surface.

13. The method according to claim 10, further comprising:
forming the second substrate assembly by combining a second metal layer, a second insulating layer and the second shaped metal layer;
forming the second shaped metal layer by multi-layer etching of the third surface.

14. The method according to claim 10, wherein forming the first surface and the third surface includes multi-layer etching the stepped patterns that fit with each other to receive the one or more chips.

15. The method according to claim 10, further comprising:
coupling the one or more chips to a lead frame via a metal conductor wire.

16. A device, comprising:
a first substrate assembly that includes:
a first shaped metal layer having a first portion and a second portion; and
a second substrate assembly that includes:
a second shaped metal layer that faces the first shaped metal layer, the second shaped metal layer including a first portion having a first thickness and a second portion having a second thickness smaller than the first thickness, the first portion of the second shaped metal layer coupled to the first portion of the first shaped metal layer; and
a chip coupled to the second portion of the second shaped metal layer, the second portion of the second shaped metal layer being spaced from the second portion of the first shaped metal layer by the chip.

17. The device of claim 16, wherein the second portion of the first shaped metal layer is coupled to the chip.

\* \* \* \* \*